(12) United States Patent
Kang et al.

(10) Patent No.: US 11,348,827 B2
(45) Date of Patent: May 31, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Sung Jin Kang, Seoul (KR); Jong Min Baek, Seoul (KR); Woo Kyung You, Hwaseong-si (KR); Kyu-Hee Han, Hwaseong-si (KR); Han Seong Kim, Suwon-si (KR); Jang Ho Lee, Hwaseong-si (KR); Sang Shin Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/798,789

(22) Filed: Feb. 24, 2020

(65) Prior Publication Data
US 2021/0020497 A1 Jan. 21, 2021

(30) Foreign Application Priority Data
Jul. 17, 2019 (KR) ................ 10-2019-0086056

(51) Int. Cl.
H01L 21/768 (2006.01)
H01L 23/48 (2006.01)

(52) U.S. Cl.
CPC ...... H01L 21/76808 (2013.01); H01L 23/481 (2013.01); H01L 21/76832 (2013.01)

(58) Field of Classification Search
CPC .............. H01L 28/24; H01L 23/5228; H01L 21/76808; H01L 23/481; H01L 21/76832; H01L 21/76834; H01L 23/53295
See application file for complete search history.

(56) References Cited

U.S. PATENT DOCUMENTS

| | | |
|---|---|---|
| 7,202,549 B2 | 4/2007 | Hashimoto et al. |
| 7,217,981 B2 | 5/2007 | Coolbaugh et al. |
| 8,174,355 B2 | 5/2012 | Takeda et al. |
| 8,236,663 B2 | 8/2012 | Coolbaugh et al. |
| 9,502,284 B2 | 11/2016 | Ali et al. |
| 2004/0238962 A1 | 12/2004 | Jung et al. |
| 2012/0009756 A1* | 1/2012 | Fujiwara .............. H01L 28/24 438/382 |

(Continued)

FOREIGN PATENT DOCUMENTS

JP 2004273925 A 9/2004

Primary Examiner — Thanhha S Pham
(74) Attorney, Agent, or Firm — Lee IP Law, P.C.

(57) ABSTRACT

A semiconductor device including a first interlayer insulating film; a conductive pattern in the first interlayer insulating film; a resistance pattern on the conductive pattern; an upper etching stopper film spaced apart from the resistance pattern, extending in parallel with a top surface of the resistance pattern, and including a first metal; a lower etching stopper film on the conductive pattern, extending in parallel with a top surface of the first interlayer insulating film, and including a second metal; and a second interlayer insulating film on the upper etching stopper film and the lower etching stopper film, wherein a distance from a top surface of the second interlayer insulating film to a top surface of the upper etching stopper film is smaller than a distance from the top surface of the second interlayer insulating film to a top surface of the lower etching stopper film.

17 Claims, 26 Drawing Sheets

(56) References Cited

U.S. PATENT DOCUMENTS

| | | | |
|---|---|---|---|
| 2013/0168815 A1* | 7/2013 | Le Neel | G01K 7/20 |
| | | | 257/536 |
| 2015/0048298 A1* | 2/2015 | Hsieh | H01L 45/1226 |
| | | | 257/4 |
| 2015/0187632 A1* | 7/2015 | Ali | H01L 28/24 |
| | | | 257/537 |
| 2017/0053967 A1* | 2/2017 | Chuang | H01L 27/2436 |

* cited by examiner

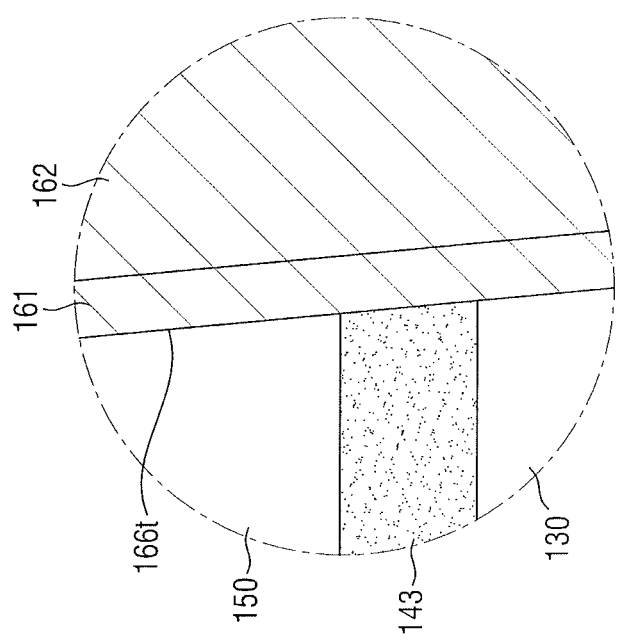

SEMICONDUCTOR DEVICE AND METHOD OF FABRICATING THE SAME

CROSS-REFERENCE TO RELATED APPLICATION

Korean Patent Application No. 10-2019-0086056, filed on Jul. 17, 2019, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Due to the development of electronic technology and the recent trend of down-scaling, semiconductor chips may have high integration density and low power consumption. In order to achieve these properties, the feature size of semiconductor devices may decrease.

SUMMARY

The embodiments may be realized by providing a semiconductor device including a first interlayer insulating film; a conductive pattern in the first interlayer insulating film; a resistance pattern on the conductive pattern; an upper etching stopper film spaced apart from the resistance pattern, extending in parallel with a top surface of the resistance pattern, and including a first metal; a lower etching stopper film on the conductive pattern, extending in parallel with a top surface of the first interlayer insulating film, and including a second metal; and a second interlayer insulating film on the upper etching stopper film and the lower etching stopper film, wherein a distance from a top surface of the second interlayer insulating film to a top surface of the upper etching stopper film is smaller than a distance from the top surface of the second interlayer insulating film to a top surface of the lower etching stopper film.

The embodiments may be realized by providing a semiconductor device including a substrate; a first connecting wire in an interlayer insulating film on the substrate; a resistance pattern on the interlayer insulating film; a first etching stopper film on a top surface of the resistance pattern; a second etching stopper film on the interlayer insulating film, extending in parallel with a top surface of the interlayer insulating film, on sidewalls of the resistance pattern, and on a top surface of the first etching stopper film, and including a metal; and a first via penetrating the second etching stopper film, the first via being connected to the first connecting wire.

The embodiments may be realized by providing a semiconductor device including a first interlayer insulating film; a first connecting wire in the first interlayer insulating film; a first etching stopper film on the first interlayer insulating film; a resistance pattern on the first etching stopper film and including titanium nitride; a second etching stopper film on the resistance pattern and in contact with a top surface of the resistance pattern, the second etching stopper film not extending onto sidewalls of the resistance pattern; a third etching stopper film extending along a top surface of the first etching stopper film, the sidewalls of the resistance pattern, and sides and a top surface of the second etching stopper film, the third etching stopper film including aluminum; a second interlayer insulating film on the third etching stopper film; a wire via in the second interlayer insulating film, the wire via being connected to the first connecting wire and passing through the third etching stopper film and the first etching stopper film; a resistance via in the second interlayer insulating film the resistance via being connected to the resistance pattern and passing through the third etching stopper film and the second etching stopper film; and a second connecting wire on the wire via and the resistance via, the second connecting wire being connected to at least one of the wire via and the resistance via.

The embodiments may be realized by providing a method of fabricating a semiconductor device, the method including sequentially forming a resistance pattern and a first etching stopper film on a first interlayer insulating film; forming a second etching stopper film on the first interlayer insulating film and on the first etching stopper film such that the second etching stopper film includes a first metal; forming a second interlayer insulating film on the second etching stopper film; forming a hard mask pattern on the second interlayer insulating film such that the hard mask pattern includes a second metal; forming a via trench that exposes the second etching stopper film by using the hard mask pattern; exposing part of the first etching stopper film by removing the hard mask pattern and part of the second etching stopper film exposed by the via trench at the same time; exposing the resistance pattern by removing the exposed part of the first etching stopper film; and forming a via that is connected to the resistance pattern by filling the via trench.

BRIEF DESCRIPTION OF THE DRAWINGS

Features will be apparent to those of skill in the art by describing in detail exemplary embodiments with reference to the attached drawings in which:

FIGS. 2A and 2B illustrate enlarged cross-sectional views of an area enclosed by a dotted line of FIG. 1;

DETAILED DESCRIPTION

Figure 1:
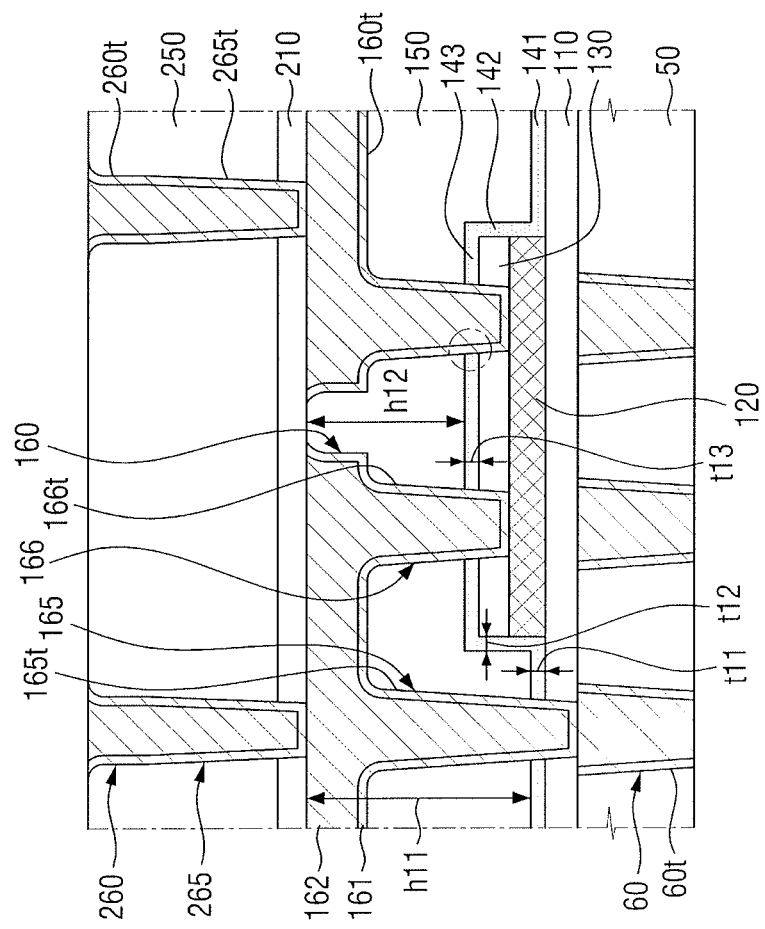
FIG. 1 illustrates a cross-sectional view of a semiconductor device according to some embodiments of the present disclosure.
Figure 2B:
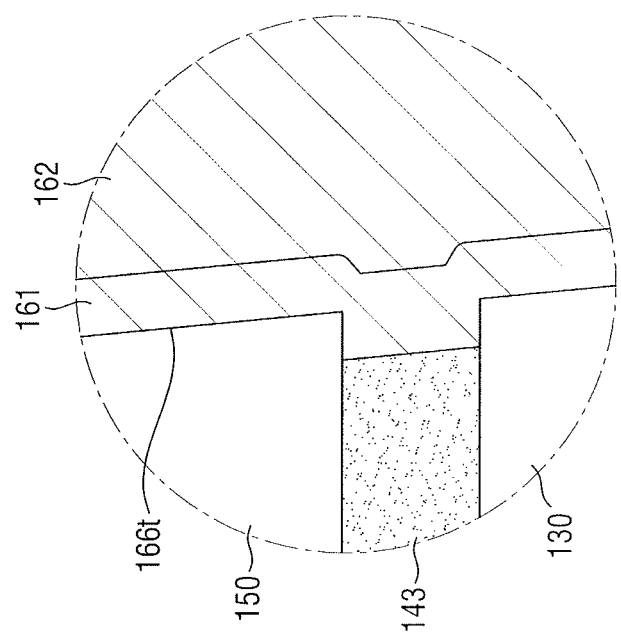

FIG. 1 illustrates a cross-sectional view of a semiconductor device according to some embodiments of the present disclosure. FIGS. 2A and 2B illustrate enlarged cross-sectional views of an area enclosed by a dotted line of FIG. 1.

Referring to FIGS. 1, 2A, and 2B, the semiconductor device may include a conductive pattern 60, a resistance pattern 120, a first lower etching stopper film 110, a first upper etching stopper film 130, a lower etching stopper capping film 141, an upper etching stopper capping film 143, a first connecting wire 160, a first wiring via 165, and a resistance via 166.

The conductive pattern 60 may be in a lower interlayer insulating film 50. The lower interlayer insulating film 50 may include a conductive pattern trench 60t. The conductive patterns 60 may fill the conductive pattern trench 60t. The conductive pattern 60 may include a barrier film that extends along the sidewalls of the conductive pattern trench 60t and a filling film on the barrier film.

The lower interlayer insulating film 50 may cover gate electrodes and sources/drains of transistors in a front-end-of-line (FEOL) process. In an implementation, the lower interlayer insulating film 50 may be an interlayer insulating film formed in a back-end-of-line (BEOL) process.

In an implementation, the conductive pattern 60 may be a contact or a contact wire formed in a middle-of-line (MOL) process. In an implementation, the conductive pattern 60 may be a connecting wire formed in the BEOL process.

The lower interlayer insulating film 50 may include, e.g., silicon oxide, silicon nitride, silicon oxynitride, or a low-k dielectric material. As used herein, the term "or" is not an exclusive term, e.g., "A or B" would include A, B, or A and B.

In an implementation, the low interlayer insulating film 50 may include a low-k dielectric material to help reduce a coupling phenomenon between conductive patterns. The low-k dielectric material may include, e.g., silicon oxide with moderately high carbon and hydrogen contents, such as SiCOH.

In an implementation, carbon may be included in the low-k dielectric material, and the dielectric constant of the low-k dielectric material may be lowered. In an implementation, in order to further lower the dielectric constant of the low-k dielectric material, the low-k dielectric material may include pores such as cavities filled with a gas or air.

In an implementation, the low-k dielectric material may be or may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polyimide nanofoams such as polypropylene oxide, carbon doped silicon oxide (CDO), organo silicate glass (OSG), SiLK™, amorphous fluorinated carbon, silica aerogels, silica xerogels, mesoporous silica, or a combination thereof.

The first lower etching stopper film 110 may be on the lower interlayer insulating film 50. The first lower etching stopper film 110 may extend along top surfaces of the lower interlayer insulating film 50 and the conductive pattern 60.

The first lower etching stopper film 110 may include, e.g., a silicon (Si) insulating material. In an implementation, the first lower etching stopper film 110 may include, e.g., a Si insulating material film.

The resistance pattern 120 may be on the first lower etching stopper film 110. The resistance pattern 120 may be on the conductive pattern 60 and may have a lower conductivity than the conducive pattern 60. The first lower etching stopper film 110 may be between the resistance pattern 120 and the conductive pattern 60, and the resistance pattern 120 may be spaced apart from the conductive pattern 60.

The resistance pattern 120 may be on a top surface of the first lower etching stopper film 110. The resistance pattern 120 may extend along the top surface of the first lower etching stopper film 110.

The resistance pattern 120 may be in contact with the first lower etching stopper film 110.

In an implementation, the resistance pattern 120 may include, e.g., a conductive material containing titanium (Ti), a conductive material containing tantalum (Ta), or a conductive material containing tungsten (W). The resistance pattern 120 may include a titanium nitride (TiN) film containing TiN. Here, the term "TiN" simply refers to a material containing both Ti and N, and does not necessarily mean or define the ratio of Ti and N in the material.

In an implementation, the resistance pattern 120 may be formed in the BEOL process.

The first upper etching stopper film 130 may be on the resistance pattern 120. The first upper etching stopper film 130 may extend along a top surface of the resistance pattern 120. The resistance pattern 120 may be between the first upper etching stopper film 130 and the lower etching stopper film 110.

The first upper etching stopper film 130 may include, e.g., a Si insulating material. The first upper etching stopper film 130 may include a Si insulating material film.

The first upper etching stopper film 130 and the first lower etching stopper film 110 may each independently include, e.g., silicon nitride (SiN), silicon carbonitride (Sic), silicon carbonate (SiCO), silicon oxynitride (SiON), silicon oxide (SiO), or silicon oxynitride (SiOCN). The terms above, e.g., "SiCO", simply refers to a material containing Si, C, and oxygen (O), and does not necessarily mean or define the ratio of Si, C, and O in the material.

The lower etching stopper capping film 141 may be on the first lower etching stopper film 110. The lower etching stopper capping film 141 may be on the conductive pattern 60. The first lower etching stopper film 110 may be between the lower etching stopper capping film 141 and the conductive pattern 60 and between the lower etching stopper capping film 141 and the lower interlayer insulating film 50.

The lower etching stopper capping film 141 may extend along the top surface of the first lower etching stopper film 110. The lower etching stopper capping film 141 may be in contact with the first lower etching stopper film 110.

The lower etching stopper capping film 141 may not extend along the top surface of the resistance pattern 120. The lower etching stopper capping film 141 may not extend between the resistance pattern 120 and the first lower etching stopper film 110.

The upper etching stopper capping film 143 may be on the resistance pattern 120. The upper etching stopper capping film 143 may extend along the top surface of the resistance pattern 120 (e.g., in parallel with the top surface of the resistance pattern 120).

The upper etching stopper capping film 143 may be spaced apart from the resistance pattern 120. The first upper etching stopper film 130 may be between the upper etching stopper capping film 143 and the resistance pattern 120. The upper etching stopper capping film 143 may be in contact with the first upper etching stopper film 130.

A connecting etching stopper capping film 142 may be on the first lower etching stopper film 110. The connecting etching stopper capping film 142 may be on sidewalls of the resistance pattern 120.

In an implementation, the connecting etching stopper capping film 142 may be in contact with the sidewalls of the resistance pattern 120. In an implementation, the connecting etching stopper capping film 142 may not be in contact with the sidewalls of the resistance pattern 120.

The connecting etching stopper capping film 142 may connect the lower etching stopper capping film 141 and the upper etching stopper capping film 143. The connecting etching stopper capping film 142 may be directly connected to the lower etching stopper capping film 141. The connecting etching stopper capping film 142 may be directly connected to the upper etching stopper film 143.

The lower etching stopper capping film 141 may include, e.g., an insulating material containing a first metal. The upper etching stopper capping film 143 and the connecting etching stopper capping film 142 may include, e.g., an insulating material containing a second metal. In an implementation, the first metal may be the same as the second metal. In an implementation, the first metal and the second metal may be, e.g., aluminum (Al).

In an implementation, the lower etching stopper capping film 141, the upper etching stopper capping film 143, and the connecting etching stopper capping film 142 may include, e.g., aluminum oxide (AlO), aluminum nitride (AlN), or aluminum oxycarbide (AlOC).

Here, the term "AlOC" simply refers to a material containing Al, O, and C, and does not necessarily mean or define the ratio of Al, O, and C in the material.

A thickness t13 (in a vertical direction) of the upper etching stopper capping film 143 may be the same as a thickness t12 (in a horizontal direction orthogonal to the vertical direction) of the connecting etching stopper capping film 142. The thickness t13 of the upper etching stopper capping film 143 may be the same as a thickness t11 (in the vertical direction) of the lower etching stopper capping film 141.

Herein, the description of layers or elements having the same thickness not only means that the two elements have completely the same thickness, but also implies that there may exist a slight difference between the thicknesses of the two elements due to, e.g., process margins.

The etching stopper capping films (141, 142, and 143) may include the lower etching stopper capping film 141, the upper etching stopper capping film 143, and the connecting etching stopper capping film 142. The etching stopper capping film (141, 142, and 143) may serve as an etching stopper. For example, the lower etching stopper capping film 141, the upper etching stopper capping film 143, and the connecting etching stopper capping film 142 may all serve as etching stoppers.

In an implementation, the etching stopper capping film (141, 142, and 143) may be formed by the same deposition process.

The etching stopper capping film (141, 142, and 143) may be on the lower interlayer insulating film 50 and the conductive pattern 60. The etching stopper capping film (141, 142, and 143) may extend along the top surface of the lower interlayer insulating film 50 and along the sidewalls and the top surface of the resistance pattern 120. The etching stopper capping film (141, 142, and 143) may extend along the top surface of the first lower etching stopper film 110, along the sidewalls of the resistance pattern 120, and along the top surface of the first upper etching stopper film 130.

The etching stopper capping film (141, 142, and 143) may be in contact with the first lower etching stopper film 110 and the first upper etching stopper film 130.

The thickness t13 of a part (upper etching stopper capping film 143) of the etching stopper capping film (141, 142, and 143) in contact with the top surface of the resistance pattern 120 may be the same as the thickness t12 of a part (the connecting etching stopper capping film 142) of the etching stopper capping film (141, 142, and 143) on the sidewalls of the resistance pattern 120. In an implementation, the thickness t13 of the part of the etching stopper capping film (141, 142, and 143) in contact with the top surface of the resistance pattern 120 may be the same as the thickness t11 of a part (the lower etching stopper capping film 141) of the etching stopper capping film (141, 142, and 143) not in contact with the top surface of the resistance pattern 120.

The first lower etching stopper film 110 and the lower etching stopper capping film 141 may form a lower etching stopper structure (110 and 141). The first upper etching stopper film 130 and the upper etching stopper capping film 143 may form an upper etching stopper structure (130 and 143).

The upper etching stopper structure (130 and 143) may be on the top surface of the resistance pattern 120. The lower etching stopper structure (110 and 141) may be on a bottom surface (and a part of a side surface) of the resistance pattern 120.

The lower etching stopper structure (110 and 141), which is on the lower interlayer insulating film 50, may have the same stack structure as the upper etching stopper structure (130 and 143). For example, the lower etching stopper structure (110 and 141) and the upper etching stopper structure (130 and 143) may have a stack structure in which a Si insulating material film and an Al insulating material film are sequentially stacked.

A first interlayer insulating film 150 may be on the lower etching stopper capping film 141, the upper etching stopper capping film 143, and the connecting etching stopper capping film 142. The first interlayer insulating film 150 may include a first connecting wire trench 160t, a first wire via trench 165t, and a resistance via trench 166t. In an implementation, sidewalls of the first connecting wire trench 160t may be partially rounded.

The first wire via trench 165t may expose the conductive pattern 60 through the lower etching stopper capping film 141 and the first lower etching stopper film 110. The resistance via trench 166t may expose the resistance pattern 120 through the upper etching stopper capping film 143 and the first upper etching stopper film 130. In an implementation, the first wire via trench 165t and the resistance via trench 166t may be formed at the bottom of, e.g., the first connecting wire trench 160t.

The first connecting wire 160, the first wire via 165, and the resistance via 166 may be in the first interlayer insulating film 150. The first connecting wire 160 may be connected to the first wire via 165 and the resistance via 166.

The first connecting wire 160 may fill the first connecting wire trench 160t. The first wire via 165 may fill the first wire via trench 165t. The first wire via 165 may be connected to the conductive pattern 60 through the lower etching stopper capping film 141 and the first lower etching stopper film 110. The resistance via 166 may fill the resistance via trench 166t. The resistance via 166 may be connected to the resistance pattern 120 through the upper etching stopper capping film 143 and the first upper etching stopper film 130.

A distance h12 from the top surface of the first interlayer insulating film 150 to the top surface of the upper etching stopper capping film 143 may be smaller than a distance h11 from the top surface of the first interlayer insulating film 150 to the top surface of the lower etching stopper capping film 141 (e.g., as measured in a same direction). For example, there may be a height difference between the upper etching stopper capping film 143 and the lower etching stopper capping film 141.

The first connecting wire 160, the first wire via 165, and the resistance via 166 may each include a barrier film 161 and a filling film 162. The barrier film 161 may extend along the sidewalls and the bottom of the first connecting wire trench 160t, the sidewalls and the bottom of the first wire via trench 165t, and the sidewalls and the bottom of the resistance via trench 166t. The filling film 162 may be on the barrier film 161.

Referring to FIG. 2A, the barrier film 161 may penetrate into or through the upper etching stopper capping film 143 (which is between the first upper etching stopper film 130 and the first interlayer insulating film 150). The first upper etching stopper film 130 and the first interlayer insulating film 150 may face each other with the upper etching stopper capping film 143 therebetween.

Referring to FIG. 2B, part of the barrier film 161 may penetrate into the upper etching stopper capping film 143 to be between the first upper etching stopper film 130 and the first interlayer insulating film 150.

In an implementation, the barrier film 161 may include, e.g., Ta, tantalum nitride (TaN), Ti, TiN, ruthenium (Ru), cobalt (Co), nickel (Ni), nickel boron (NiB), W, tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh).

In an implementation, the filling film 162 may include, e.g., Al, Cu, W, Co, or Ru.

In a case where the filling film 162 includes copper (Cu), the filling film 162 may further include, e.g., carbon (C), silver (Ag), Co, Ta, indium (In), tin (Sn), zinc (Zn), manganese (Mn), Ti, magnesium (Mg), chromium (Cr), germanium (Ge), strontium (Sr), Pt, Al, or Zr.

In an implementation, as illustrated in FIG. 1, the resistance pattern 120 and the conductive pattern 60 may be connected via the first connecting wire 160, the first wire via 165, and the resistance via 166. In an implementation, the resistance pattern 120 may not be connected to the conductive pattern 60 via the first connecting wire 160.

The first interlayer insulating film 150 may include, e.g., silicon oxide, silicon nitride, silicon oxynitride, or a low-k dielectric material.

A second etching stopper film 210 and a second interlayer insulating film 250 may be sequentially disposed on the first interlayer insulating film 150 and the first connecting wire 160. The second etching stopper film 210 may include a Si insulating material film. The second etching stopper film 210 may include, e.g., SiN, SiCN, SiCO, SiON, SiO, or SiOCN.

The second interlayer insulating film 250 may include a second connecting wire trench 260t and a second wire via trench 265t. The second wire via trench 265t may expose the first connecting wire 160 through the second etching stopper film 210.

A second connecting wire 260 and a second wire via 265 may be in the second interlayer insulating film 250. The second connecting wire 260 may be connected to the second wire via 265.

The second connecting wire 260 may fill the second connecting wire trench 260t. The second wire via 265 may fill the second wire via trench 265t. The second wire via 265 may be connected to the first connecting wire 160 and may pass through the second etching stopper film 210. In an implementation, the sidewalls of the second connecting wire 260t may be partially rounded.

The lower etching stopper structure (110 and 141), which is in the lower interlayer insulating film 50, may have a different stack structure from the second etching stopper film 210. For example, the lower etching stopper structure (110 and 141) may have a stack structure in which a Si insulating material film and an Al insulating material film are sequentially stacked, and the second etching stopper film 210 may have a single-layer structure or a stack of a plurality of Si insulating material films.

The structure of the second etching stopper film 210, which is penetrated by the second wire via 265, may have a different stack structure from the lower etching stopper structure (110 and 141), which is penetrated by the first wire via 165.

The second connecting wire 260 and the second wire via 265 may each include a barrier film and a filling film.

The second interlayer insulating film 250 may include, e.g., silicon oxide, silicon nitride, silicon oxynitride, or a low-k dielectric material. The second interlayer insulating film 250 may include, e.g., a material having etching selectivity with respect to the second etching stopper film 210.

Figure 3:
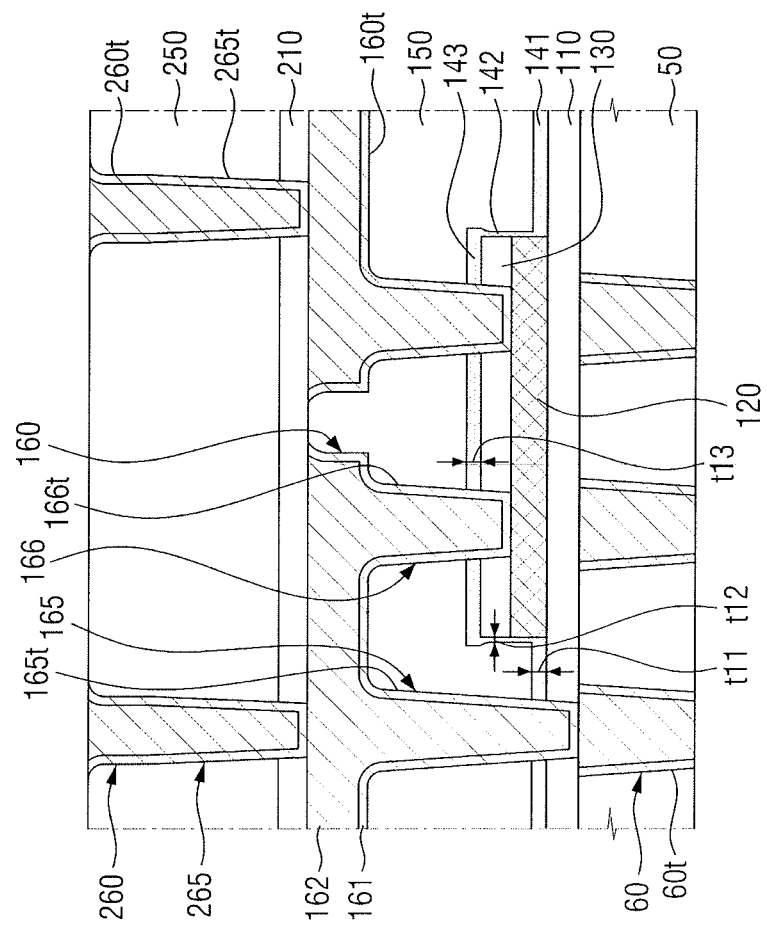
FIG. 3 illustrates a cross-sectional view of a semiconductor device according to some embodiments of the present disclosure.

FIG. 3 illustrates a cross-sectional view of a semiconductor device according to some embodiments of the present disclosure. For convenience, the semiconductor device of FIG. 3 will hereinafter be described, focusing mainly on the differences with the semiconductor device of FIGS. 1 through 2B.

Referring to FIG. 3, a thickness t13 of an upper etching stopper capping film 143 may be greater than a thickness t12 of a connecting etching stopper capping film 142.

The thickness t13 of the upper etching stopper capping film 143 may be the same as a thickness t11 (in the vertical direction) of a lower etching stopper capping film 141.

In an implementation, as illustrated in FIG. 3, there may be an overhang at a location where the upper etching stopper capping film 143 and the connecting etching stopper capping film 142 are connected.

For example, the thickness t13 (in the vertical direction) of a part of an etching stopper capping film (141, 142, and 143) that overlaps with the top surface of a resistance pattern 120 may be greater than the thickness t12 (in the horizontal direction) of part of the etching stopper capping film (141, 142, and 143) that is on the sidewalls of the resistance pattern 120.

The thickness t13 of the part of an etching stopper capping film (141, 142, and 143) that overlaps with the top surface of the resistance pattern 120 may be the same as the thickness t11 of part of the etching stopper capping film (141, 142, and 143) that does not overlap with the top surface of the resistance pattern 120.

Figure 4:
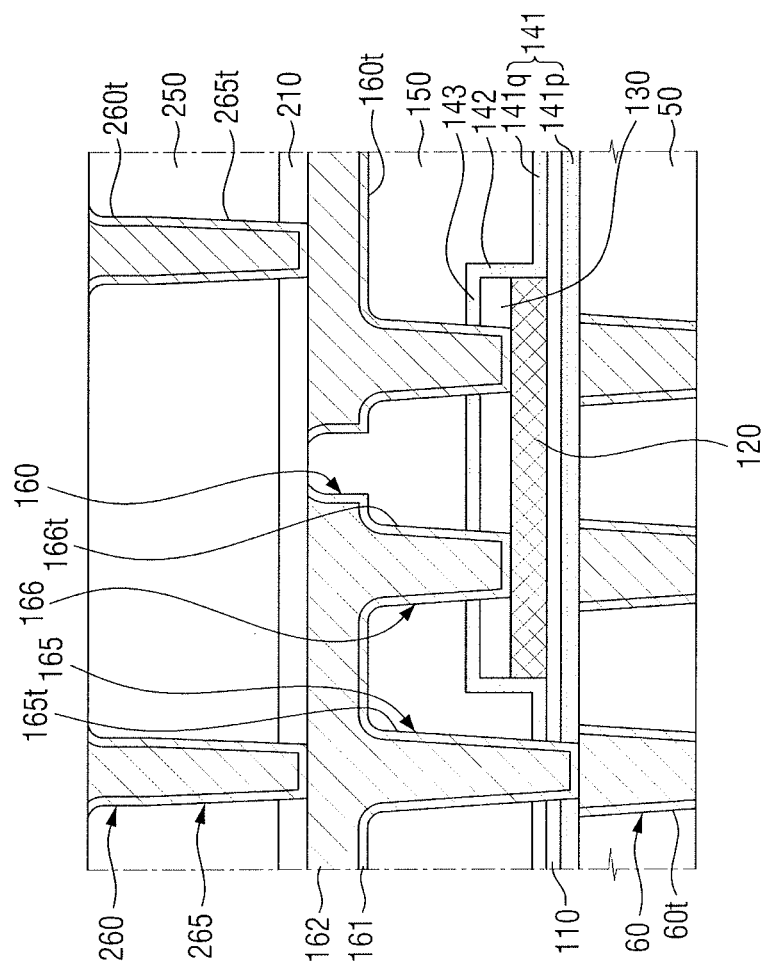
FIG. 4 illustrates a cross-sectional view of a semiconductor device according to some embodiments of the present disclosure.

FIG. 4 illustrates a cross-sectional view of a semiconductor device according to some embodiments of the present disclosure. For convenience, the semiconductor device of FIG. 4 will hereinafter be described, focusing mainly on the differences with the semiconductor device of FIGS. 1 through 2B.

Referring to FIG. 4, a lower etching stopper capping film 141 may extend between a resistance pattern 120 and a lower interlayer insulating film 50.

Part of the lower etching stopper capping film 141 may extend between the bottom surface of the resistance pattern 120 and the top surface of the lower interlayer insulating film 50. Part of an etching stopper capping film (141, 142, and 143) may extend between the resistance pattern 120 and the lower interlayer insulating film 50.

The lower etching stopper capping film 141 may include a first sub-lower etching stopper capping film 141p and a second sub-lower etching stopper capping film 141q. The first sub-lower etching stopper capping film 141p may extend between a first lower etching stopper film 110 and the lower interlayer insulating film 50. The lower etching stopper capping film 141 may be divided into two parts by the first lower etching stopper film 110.

The resistance pattern 120 may be on the first sub-lower etching stopper capping film 141p. The first sub-lower etching stopper capping film 141p may include a part that overlaps with the resistance pattern 120 and a part that does not overlap with the resistance pattern 120.

In an implementation, the first and second sub-lower etching stopper capping films 141p and 141q may be formed by different deposition processes. For example, the second sub-lower etching stopper capping film 141q, the upper etching stopper capping film 143, and the connecting etching stopper capping film 142 may be formed by the same deposition process. The first sub-lower etching stopper capping film 141p may be formed by an earlier deposition process than the second sub-lower etching stopper capping film 141q.

The first and second sub-lower etching stopper capping films 141p and 141q may include an insulating material containing Al. The first and second sub-lower etching stopper capping films 141p and 141q may include the same material or different materials.

Figure 5:
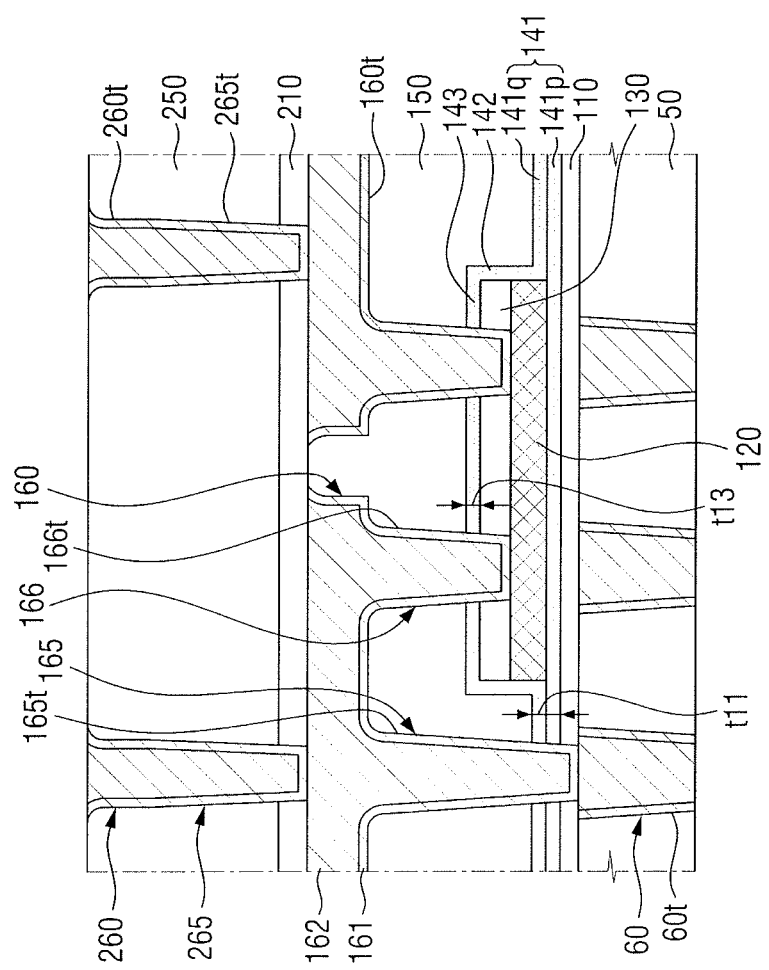
FIG. 5 illustrates a cross-sectional view of a semiconductor device according to some embodiments of the present disclosure.

FIG. 5 illustrates a cross-sectional view of a semiconductor device according to some embodiments of the present disclosure. For convenience, the semiconductor device of FIG. 5 will hereinafter be described, focusing mainly on the differences with the semiconductor device of FIG. 4.

Referring to FIG. 5, a lower etching stopper capping film 141 may extend between a resistance pattern 120 and a first lower etching stopper film 110. A first sub-lower etching stopper capping film 141p may be between the resistance pattern 120 and the first lower etching stopper film 110.

Part of the first sub-lower etching stopper capping film 141p may be between the bottom surface of the resistance pattern 120 and the top surface of the first lower etching stopper film 110. For example, the first sub-lower etching stopper capping film 141p may include a part that extends between the bottom surface of the resistance pattern 120 and the top surface of the first lower etching stopper film 110.

Part of an etching stopper capping film (141, 142, and 143) may extend between the resistance pattern 120 and the first lower etching stopper film 110. The etching stopper capping film (141, 142, and 143) may include a part that extends between the resistance pattern 120 and the first lower etching stopper film 110.

A thickness t13 (in the vertical direction) of an upper etching stopper capping film 143 may be smaller than a thickness t11 (in the vertical direction) of a lower etching stopper capping film 141. For example, the thickness t13 of part of the etching stopper capping film (141, 142, and 143) that overlaps with or overlies the top surface of the resistance pattern 120 may be smaller than the thickness t11 of part of the etching stopper capping film (141, 142, and 143) that does not overlap with or overlie the top surface of the resistance pattern 120.

Figure 6:
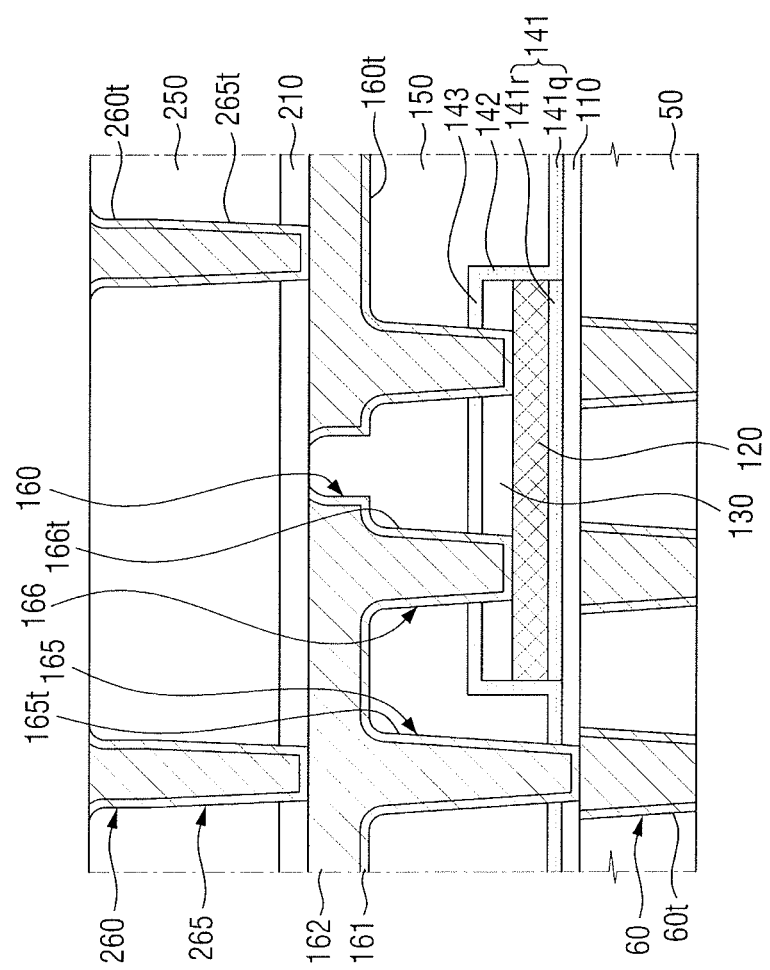
FIG. 6 illustrates a cross-sectional view of a semiconductor device according to some embodiments of the present disclosure.

FIG. 6 illustrates a cross-sectional view of a semiconductor device according to some embodiments of the present disclosure. For convenience, the semiconductor device of FIG. 6 will hereinafter be described, focusing mainly on the differences with the semiconductor device of FIGS. 1 through 2B.

Referring to FIG. 6, a lower etching stopper capping film 141 may include a second-lower etching stopper capping film 141q and a third sub-lower etching stopper capping film 141r on a first lower etching stopper film 110.

A resistance pattern 120 may be on the third sub-lower etching stopper capping film 141r. The third sub-lower etching stopper capping film 141r may extend between the resistance pattern 120 and the first lower etching stopper film 110.

The third sub-lower etching stopper capping film 141r may include a part that overlaps with the resistance pattern 120, and may not include a part that does not overlap with the resistance pattern 120 (e.g., outer edges of the third sub-lower etching stopper capping film 141r may be aligned with outer edges of the resistance pattern 120 such that a width of the third sub-lower etching stopper capping film 141r in the horizontal direction is the same as the width of the resistance pattern 120 in the horizontal direction). The third sub-lower etching stopper capping film 141r may be between the bottom surface of the resistance pattern 120 and the top surface of the first lower etching stopper film 110.

In an implementation, the second and third sub-lower etching stopper capping films 141q and 141r may be formed by different deposition processes. The third sub-lower etching stopper capping film 141r may be formed by an earlier deposition process than the second sub-lower etching stopper capping film 141q.

The thickness of an etching stopper capping film (141, 142, and 143) that overlaps with the top surface of the resistance pattern 120 may be the same as the thickness of part of the etching stopper capping film (141, 142, and 143) that does not overlap with the top surface of the resistance pattern 120.

The second and third sub-lower etching stopper capping films 141q and 141r may include an insulating material containing Al. The second and third sub-lower etching stopper capping films 141q and 141r may include the same material or different materials.

Figure 7:
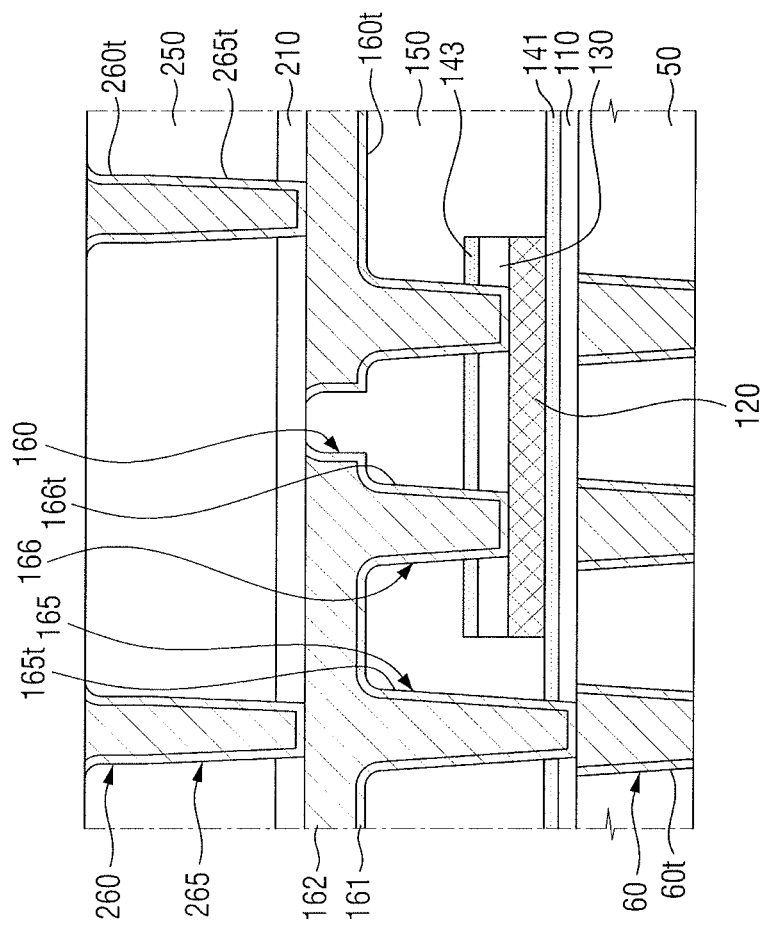
FIG. 7 illustrates a cross-sectional view of a semiconductor device according to some embodiments of the present disclosure.

FIG. 7 illustrates a cross-sectional view of a semiconductor device according to some embodiments of the present disclosure. For convenience, the semiconductor device of FIG. 7 will hereinafter be described, focusing mainly on the differences with the semiconductor device of FIGS. 1 through 2B.

Referring to FIG. 7, an upper etching stopper capping film 143 may not be connected to a lower etching stopper capping film 141.

For example, in the present embodiment, the connecting etching stopper capping film 142 of FIG. 1 may not be formed on the sidewalls of a resistance pattern 120. The lower etching stopper capping film 141 may include a part that overlaps with the resistance pattern 120 and a part that does not overlap with the resistance pattern 120. Part of the lower etching stopper capping film 141 may be between the bottom surface of the resistance pattern 120 and the top surface of a first lower etching stopper film 110.

For example, the upper etching stopper capping film 143 and the lower etching stopper capping film 141 may be formed by different deposition processes.

Figure 8:
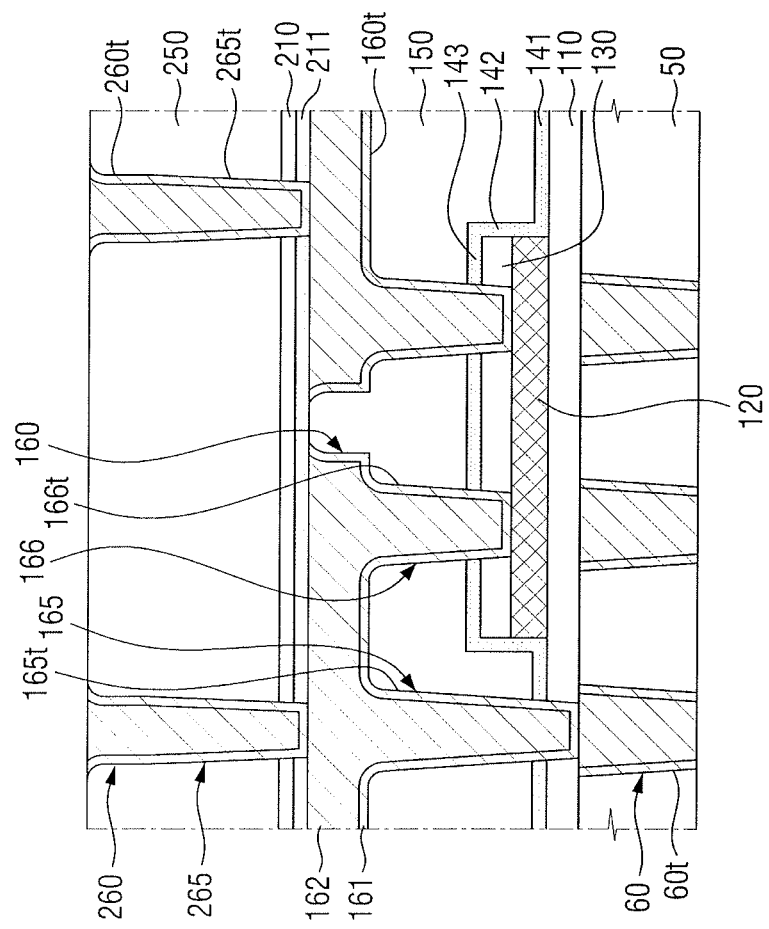
FIG. 8 illustrates a cross-sectional view of a semiconductor device according to some embodiments of the present disclosure.

FIG. 8 illustrates a cross-sectional view of a semiconductor device according to some embodiments of the present disclosure. For convenience, the semiconductor device of FIG. 8 will hereinafter be described, focusing mainly on the differences with the semiconductor device of FIGS. 1 through 2B.

Referring to FIG. 8, the semiconductor device may further include a second lower etching stopper film 211 between a second etching stopper film 210 and a first interlayer insulating film 150.

The second lower etching stopper film 211 may extend along the top surface of the first interlayer insulating film 150. A second wire via 265 may be connected to a first connecting wire 160 and may pass through the second etching stopper film 210 and the second lower etching stopper film 211.

The second lower etching stopper film 211 may include, e.g., an insulating material containing Al. The second lower etching stopper film 211 may include, e.g., AlO, AlN, or AlOC. In an implementation, the second lower etching stopper film 211 may include AlN.

A first lower etching stopper film 110 and a lower etching stopper capping film 141 may form a lower etching stopper structure (110 and 141). The second upper etching stopper film 211 and the second etching stopper film 210 may form a first etching stopper structure (210 and 211).

The lower etching stopper structure (110 and 141) and the first etching stopper structure (210 and 211) may each have a stack structure in which a Si insulating material film and an Al-based insulating material film are sequentially stacked. The lower etching stopper structure (110 and 141) and the first etching stopper structure (210 and 211) may differ from each other in the order in which the Si insulating material film and the Al insulating material film.

Figure 9:
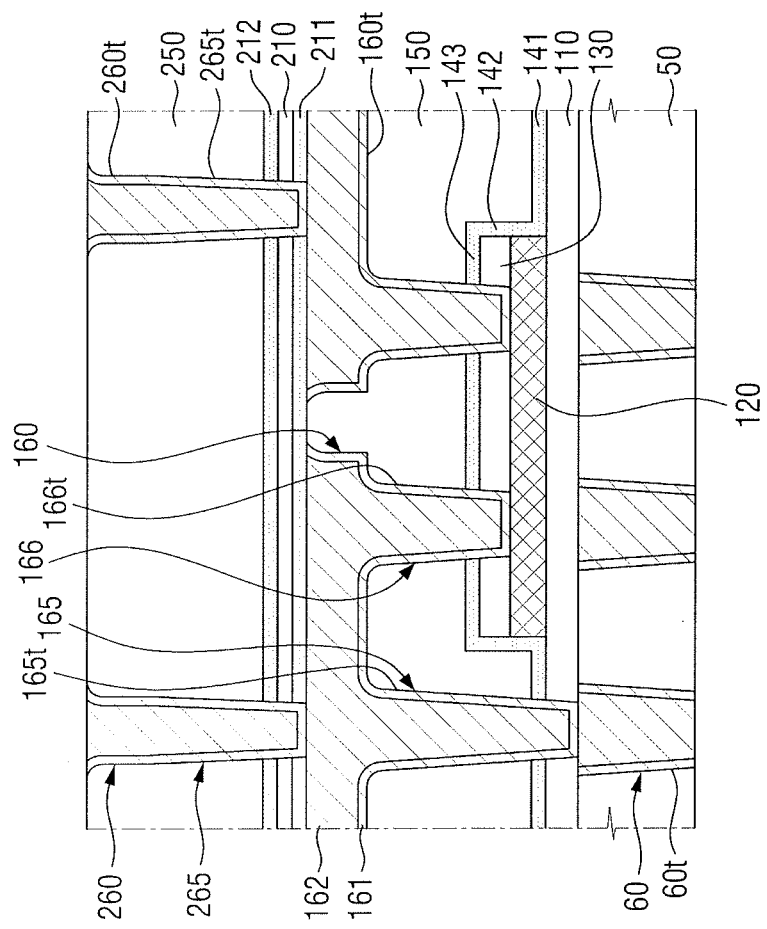
FIG. 9 illustrates a cross-sectional view of a semiconductor device according to some embodiments of the present disclosure.

FIG. 9 illustrates a cross-sectional view of a semiconductor device according to some embodiments of the present disclosure. For convenience, the semiconductor device of FIG. 9 will hereinafter be described, focusing mainly on the differences with the semiconductor device of FIG. 8.

Referring to FIG. 9, the semiconductor device may further include a second lower etching stopper film 211 on a second etching stopper film 210.

A second upper etching stopper film 212 may extend along the top surface of the second etching stopper film 210. A second wire via 265 may be connected to a first connecting wire 160 and may pass through the second upper etching stopper film 212, the second etching stopper film 210, and the second lower etching stopper film 211.

The second upper etching stopper film 212 may include, e.g., an insulating material containing Al. The second lower etching stopper film 211 may include, e.g., AlO, AlN, or AlOC.

For example, the second upper etching stopper film 212, the second etching stopper film 210, and the second lower etching stopper film 211 may form a first etching stopper structure (210, 211, and 212).

For example, a lower etching stopper structure (110 and 141), which may be on a lower interlayer insulating film 50, may have a different stack structure from the first etching stopper structure (210, 211, and 212).

For example, the lower etching stopper structure (110 and 141) may have a stack structure in which a Si insulating material film and an Al insulating material film are sequentially stacked. The first etching stopper structure (210, 211, and 212) may have a stack structure in which an Al insulating material film, a Si insulating material film, and an Al insulating material film are sequentially stacked.

In an implementation, the lower etching stopper structure (110 and 141) may have a different structure from the lower etching stopper structure (110 and 141) of FIG. 4. In this example, in an area that does not overlap with a resistance pattern 120, the lower etching stopper structure (110 and 141) and the first etching stopper structure (210, 211, and 212) may both have a stack structure in which an Al insulating material film, a Si insulating material film, and an Al insulating material film are sequentially stacked.

Figure 10:
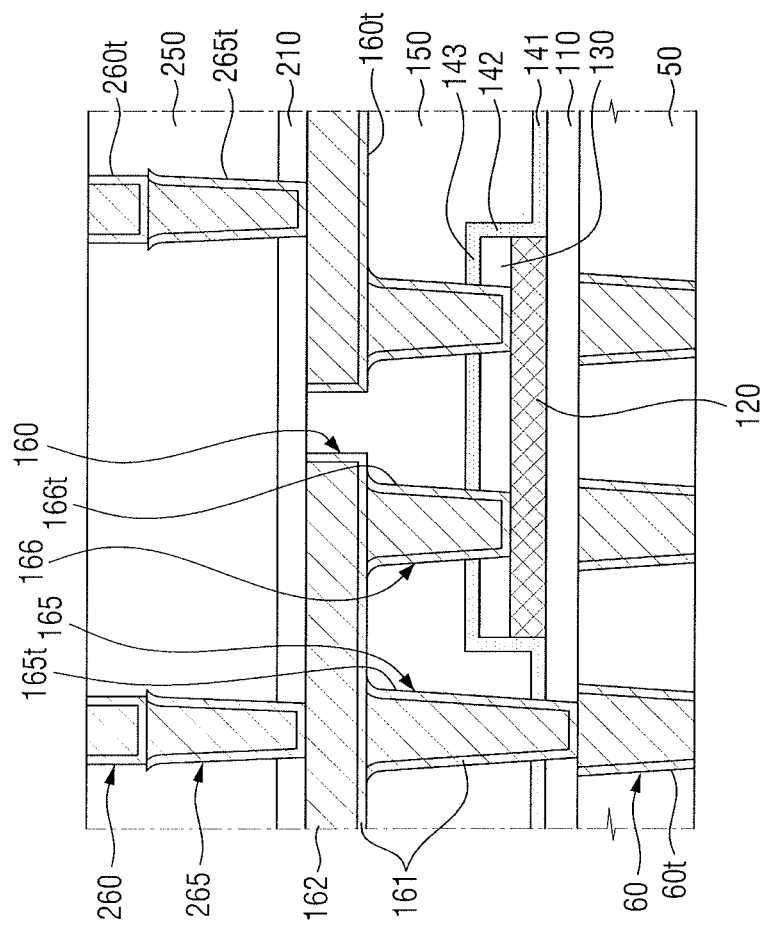
FIG. 10 illustrates a cross-sectional view of a semiconductor device according to some embodiments of the present disclosure.

FIG. 10 illustrates a cross-sectional view of a semiconductor device according to some embodiments of the present disclosure. For convenience, the semiconductor device of FIG. 10 will hereinafter be described, focusing mainly on the differences with the semiconductor device of FIGS. 1 through 2B.

Referring to FIG. 10, a filling film 162 of a first connecting wire 160 and a filling film 162 of a first wire via 165 may be separated by a barrier film 161 of the first connecting wire 160.

For example, the first wire via 165, which fills a first wire via trench 165t, may be formed, and then, a first connecting wire trench 160t may be formed. Thereafter, the first connecting wire 160, which fills the first connecting wire trench 160t, may be formed.

In an implementation, an upper part of the first wire via trench 165t and an upper part of a second wire via trench 265t may have, e.g., a rounded shape.

Figure 11:
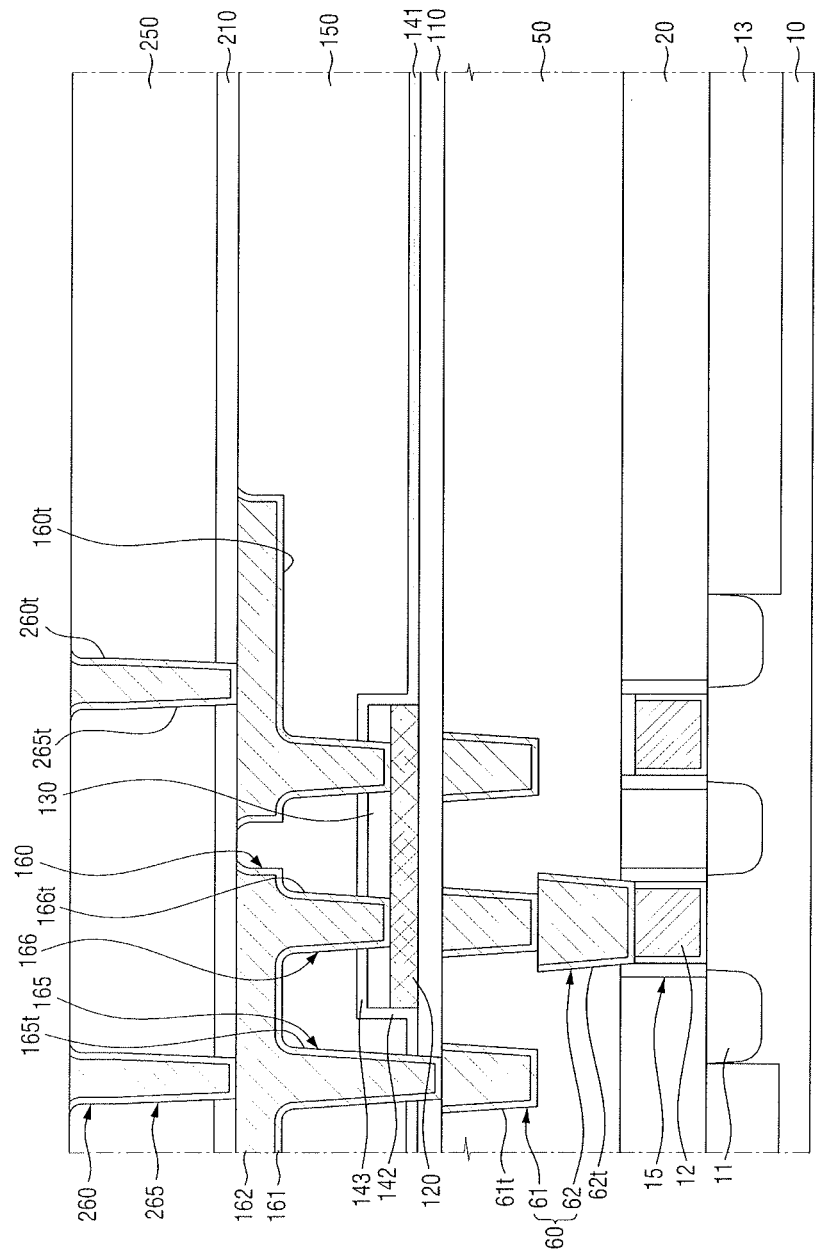
FIG. 11 illustrates a cross-sectional view of a semiconductor device according to some embodiments of the present disclosure.

FIG. 11 illustrates a cross-sectional view of a semiconductor device according to some embodiments of the present disclosure. For convenience, the semiconductor device of FIG. 11 will hereinafter be described, focusing mainly on the differences with the semiconductor device of FIGS. 1 through 2B.

Referring to FIG. 11, a conductive pattern 60 may be a contact or a contact wire formed in a MOL process.

A substrate 10 may include a field region and an active region. The field region may be a region in which a field insulating film 13 is formed. A transistor 15 may be formed in the active region of the substrate 10.

For example, the conductive pattern 60 may electrically connect the transistor 15 on the substrate 10 to a first connecting wire 160. For example, the conductive pattern 60 may include an upper contact 61 and a lower contact 62 which is between the transistor 15 and the first wire via 165. In an implementation, the conductive pattern 60 may include only one contact formed between the transistor 15 and the first wire via 165.

The lower contact 62 may fill a lower contact hole 62*t* in a lower interlayer insulating film 50. The upper contact 61 may be on the lower contact 62. The upper contact 61 may fill an upper contact hole 61*t* in the lower interlayer insulating film 50.

In an implementation, the lower contact 62 and the upper contact 61 may each include, e.g., a barrier film and a filling film.

The transistor 15 may include a gate electrode 12 and source/drain regions 11. A pre-metal dielectric layer 20 on the substrate 10 may cover the sidewalls of the gate electrode 12. In an implementation, the source/drain regions 11 may be, e.g., in the substrate 10. In an implementation, a capping pattern may be, e.g., on the gate electrode 12.

The conductive pattern 60 may be connected to the gate electrode 12, the source/drain regions 11, or both. FIG. 11 illustrates that the conductive pattern 60 is connected to the gate electrode 12.

In an implementation, as illustrated in FIG. 11, the transistor 15 may be, e.g., a planar transistor on the substrate 10. In an implementation, the transistor 15 may be, or may include, e.g., a fin field effect transistor (FinFET) including a fin-type channel region, a tunneling field effect transistor (FET), a transistor including nanowires, a transistor including a nanosheet, or a three-dimensional (3D) transistor. In an implementation, the transistor 15 may be, or may include, e.g., a bipolar junction transistor or a laterally-diffused metal-oxide semiconductor (LDMOS).

In an implementation, the gate electrode 12 may be, e.g., a replacement metal gate (RMG).

In an implementation, a resistance pattern 120 may be formed in a higher metal level (e.g., farther from the substrate 10 in the vertical direction) than the conductive pattern 60, which may be formed in a MOL process. In an implementation, the metal level of the resistance pattern 120 may be lower (e.g., closer to the substrate 10 in the vertical direction) than the metal level of the first connecting wire 160, which may be formed in a BEOL process.

The resistance pattern 120 may be on the lower interlayer insulating film 50, which vertically overlaps with the active region of the substrate 10.

Figure 12:
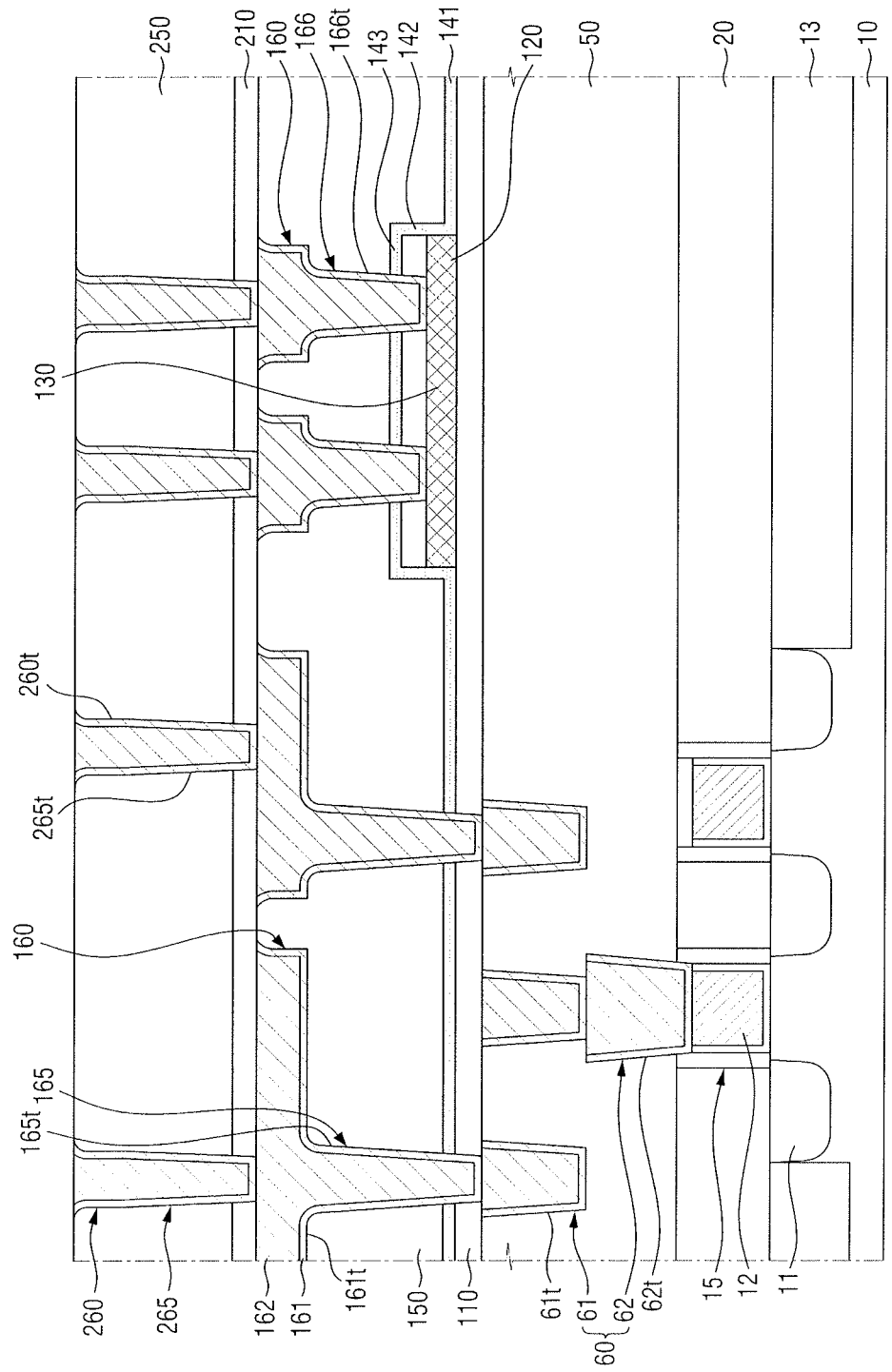
FIG. 12 illustrates a cross-sectional view of a semiconductor device according to some embodiments of the present disclosure.

FIG. 12 illustrates a cross-sectional view of a semiconductor device according to some embodiments of the present disclosure. For convenience, the semiconductor device of FIG. 12 will hereinafter be described, focusing mainly on the differences with the semiconductor device of FIG. 11.

Referring to FIG. 12, a resistance pattern 120 may be on a lower interlayer insulating film 50, which vertically overlaps or is aligned with the field region of a substrate 10.

The resistance pattern 120 may be on (e.g., may overlie) a field insulating film 13. The resistance pattern 120 may vertically overlap with the field insulating film 13.

Figure 13:
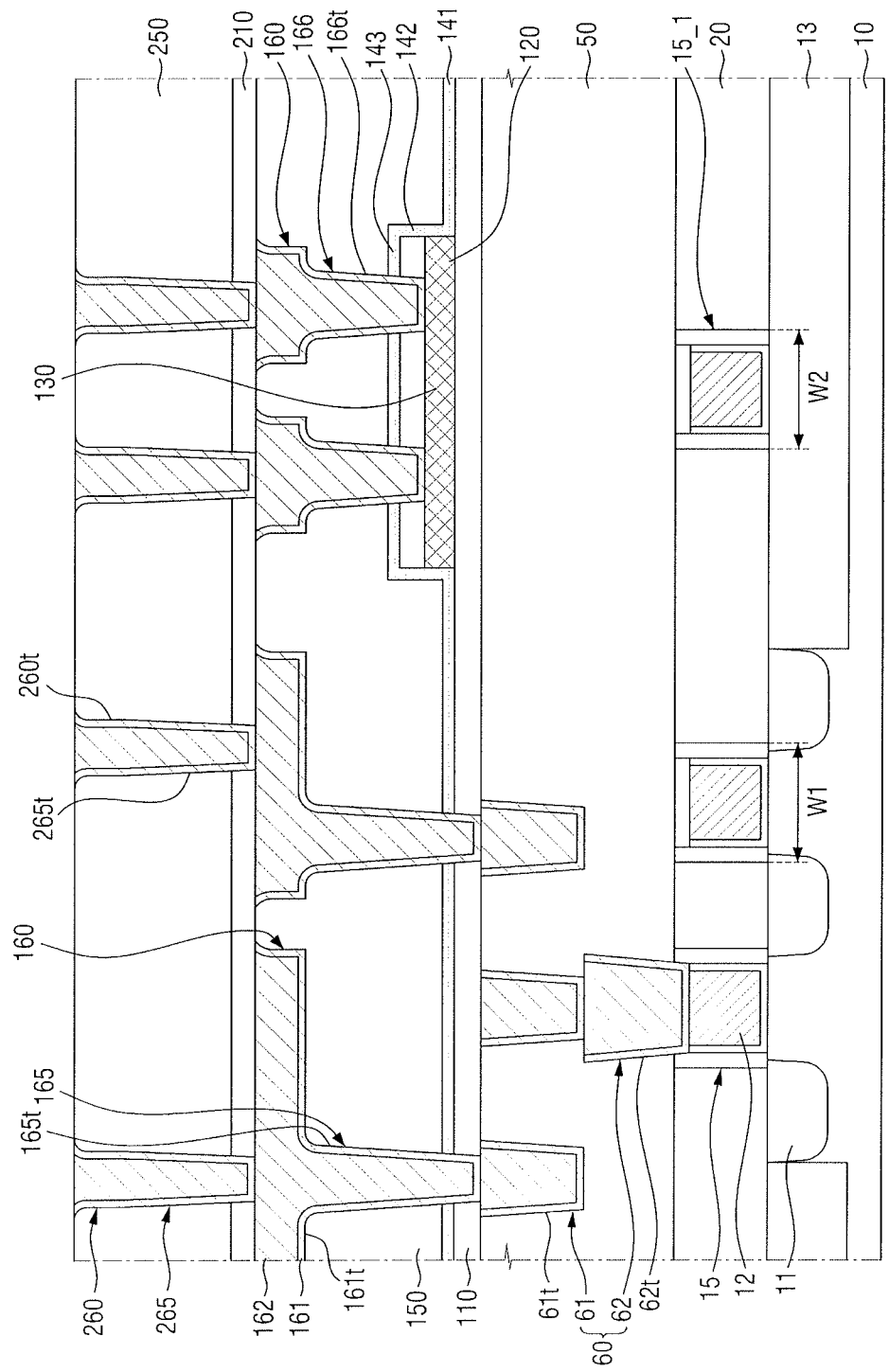
FIG. 13 illustrates a cross-sectional view of a semiconductor device according to some embodiments of the present disclosure.
Figure 14:
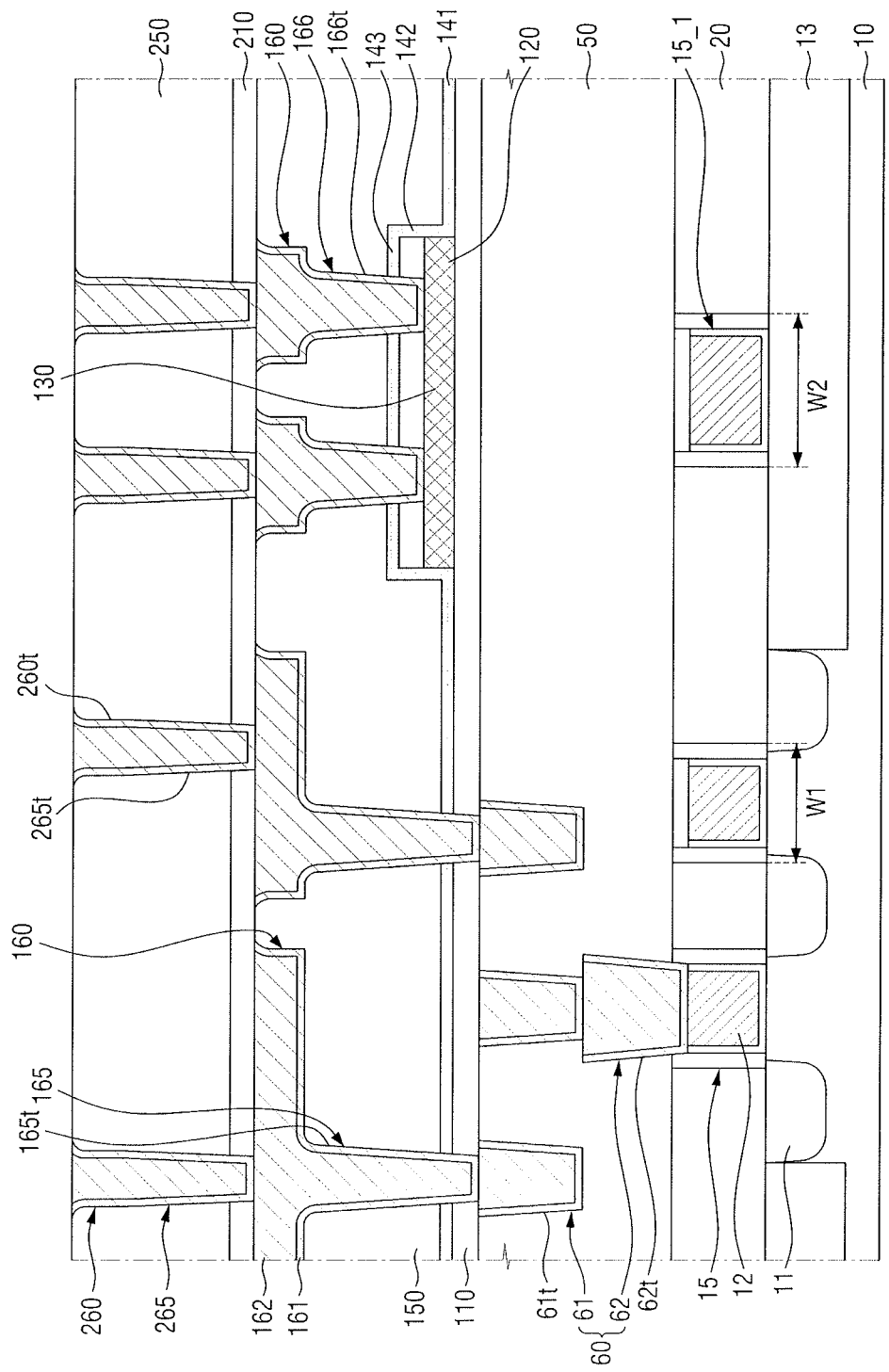
FIG. 14 illustrates a cross-sectional view of a semiconductor device according to some embodiments of the present disclosure.

FIG. 13 illustrates a cross-sectional view of a semiconductor device according to some embodiments of the present disclosure. FIG. 14 illustrates a cross-sectional view of a semiconductor device according to some embodiments of the present disclosure. For convenience, the semiconductor devices of FIGS. 13 and 14 will hereinafter be described, focusing mainly on the differences with the semiconductor device of FIG. 12.

Referring to FIGS. 13 and 14, the semiconductor device of FIG. 13 or 14 may further include a dummy transistor 15_1 on a field insulating film 13.

The dummy transistor 15_1 may be on the field insulating film 13, and the dummy transistor 15_1 may not include source/drain regions and may only include a gate stack having a gate electrode.

A resistance pattern 120 may be on (e.g., may overlie) the dummy transistor 15_1.

In an implementation, referring to FIG. 13, a width W1 (in the horizontal direction) of the gate stack of a transistor 15 may be the same as a width W2 (in the horizontal direction) of the gate stack of the dummy transistor 15_1.

In an implementation, referring to FIG. 14, the width W1 of the gate stack of a transistor 15 may be smaller than the width W2 of the gate stack of the dummy transistor 15_1.

Figure 15:
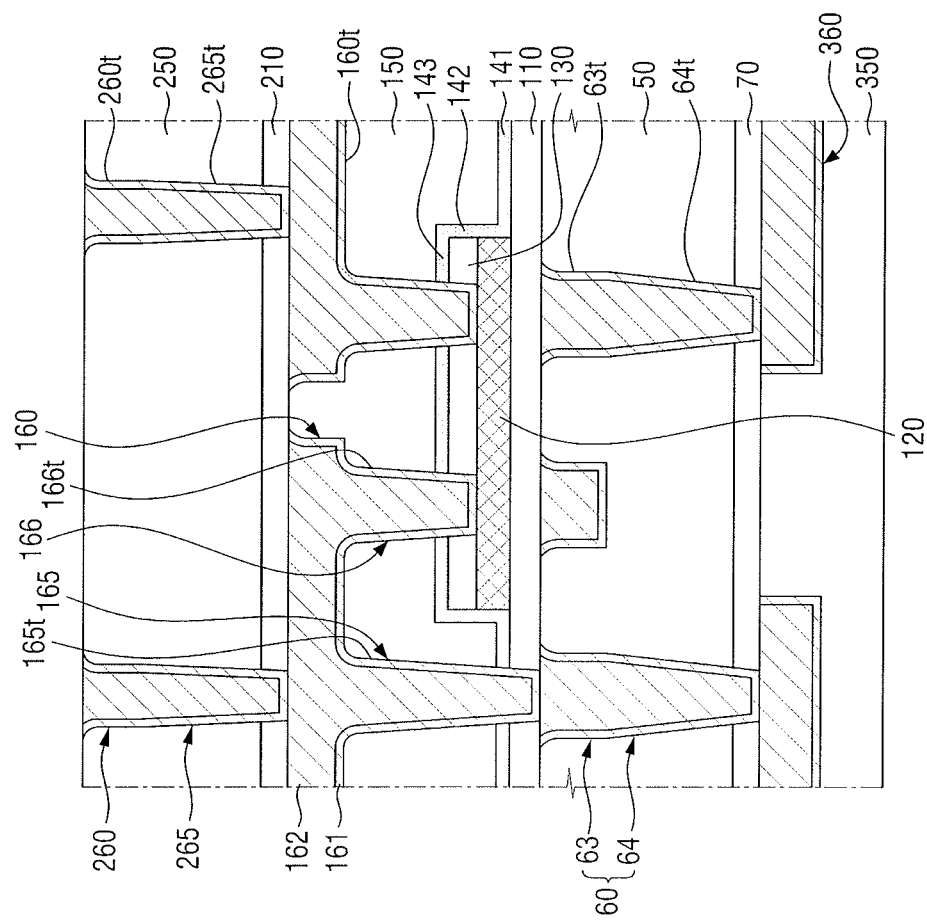
FIG. 15 illustrates a cross-sectional view of a semiconductor device according to some embodiments of the present disclosure.

FIG. 15 illustrates a cross-sectional view of a semiconductor device according to some embodiments of the present disclosure. For convenience, the semiconductor device of FIG. 15 will hereinafter be described, focusing mainly on the differences with the semiconductor device of FIGS. 1 through 2B.

Referring to FIG. 15, a conductive pattern 60 may be a connecting wire formed in a BEOL process.

The conductive pattern 60 may include a third connecting wire 63 and a third wire via 64. The third connecting wire 63 may fill a third connecting wire trench 63*t*. The third wire via 64 may fill a third wire via trench 64*t*.

The third connecting wire 63 may be in a different metal level from a first connecting wire 160. The third connecting wire 63 may be in a lower metal level than the first connecting wire 160.

The third wire via 64 may be connected to a lower conductive pattern 360 and may pass through a third etching stopper film 70. In an implementation, the lower conductive pattern 360 may be in a third interlayer insulating film 350. In an implementation, the lower conductive pattern 360 may be a connecting wire, a contact, a conductive pad, the gate electrode or the source/drain regions of a transistor, or a diode.

The third etching stopper film 70 may be between a lower interlayer insulating film 50 and the third interlayer insulating film 350. The third etching stopper film 70 may include, e.g., SiN, SiCN, SiCO, SiON, SiO, or SiOCN. The third etching stopper film 70 may include a material having etching selectivity with respect to the lower interlayer insulating film 50.

The third interlayer insulating film 350 may include, e.g., silicon oxide, silicon nitride, silicon oxynitride, or a low-k dielectric material.

A lower etching stopper structure (110 and 141), which is on the lower interlayer insulating film 50, may have a different stack structure from the third etching stopper film 70. For example, the lower etching stopper structure (110 and 141) may have a stack structure in which a Si insulating material film and an Al insulating material film are sequentially stacked. The third etching stopper film 70 may have a single-layer structure or a stack of a plurality of Si insulating material films.

Figure 16:
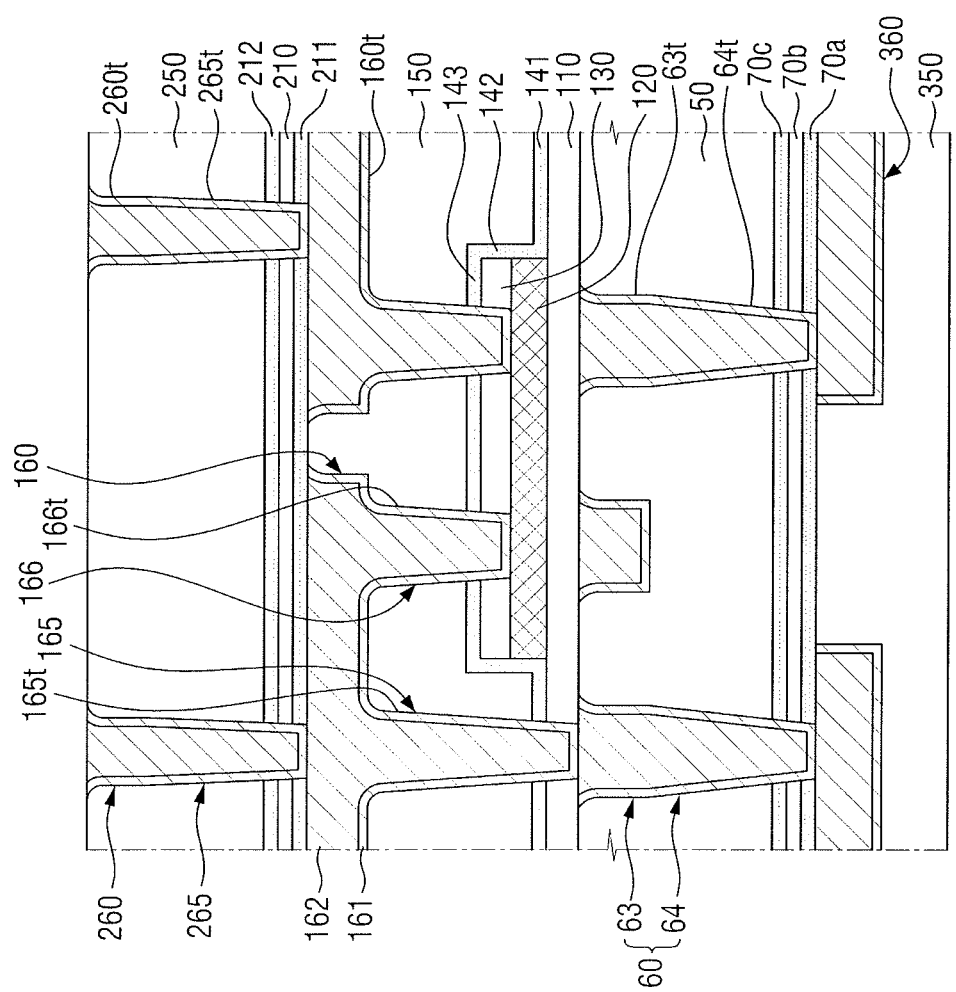
FIG. 16 illustrates a cross-sectional view of a semiconductor device according to some embodiments of the present disclosure.

FIG. 16 illustrates a cross-sectional view of a semiconductor device according to some embodiments of the present disclosure. For convenience, the semiconductor device of FIG. 16 will hereinafter be described, focusing mainly on the differences with the semiconductor device of FIGS. 9 and 15.

Referring to FIG. 16, a conductive pattern 60 may be a connecting wire formed in a BEOL process.

A third wire via 64 may be connected to a lower conductive pattern 360 and may pass through a third upper etching stopper film 70*c*, a third insertion etching stopper film 70*b*, and a third lower etching stopper film 70*a*.

The third upper etching stopper film 70*c*, the third insertion etching stopper film 70*b*, and the third lower etching stopper film 70a may be sequentially disposed between a lower interlayer insulating film 50 and a third interlayer insulating film 350.

The third insertion etching stopper film 70b may include, e.g., SiN, SiCN, SiCO, SiON, SiO, or SiOCN. The third upper etching stopper film 70c and the third lower etching stopper film 70a may include, e.g., an insulating material containing Al. The third upper etching stopper film 70c and the third lower etching stopper film 70a may include, e.g., AlO, AlN, or AlOC.

A second upper etching stopper film 212, a second etching stopper film 210, and a second lower etching stopper film 211 may form a first etching stopper structure (210, 211, and 212). The third upper etching stopper film 70c, the third insertion etching stopper film 70b, and the third lower etching stopper film 70a may form a second etching stopper structure (70a, 70b, and 70c).

A lower etching stopper structure (110 and 141), which is on the lower interlayer insulating film 50, may have a different stack structure from the first etching stopper structure (210, 211, and 212). In an implementation, the lower etching stopper structure (110 and 141) may have a different stack structure from the second etching stopper structure (70a, 70b, and 70c).

In an implementation, the lower etching stopper structure (110 and 141) may have a stack structure in which a Si insulating material film and an Al insulating material film are sequentially stacked. In an implementation, the first etching stopper structure (210, 211, and 212) and the second etching stopper structure (70a, 70b, and 70c) may each have a stack structure in which an Al insulating material film, a Si insulating material film, and an Al insulating material film are sequentially stacked.

In an implementation, the second etching stopper structure (70a, 70b, and 70c) may have a different stack structure from the first etching stopper structure (210, 211, and 212). For example, the first etching stopper structure (210, 211, and 212) may have the same stack structure as the first etching stopper structure (210 and 211) of FIG. 8 or may have the same stack structure as the second etching stopper film 210 of FIG. 1.

For example, the second etching stopper structure (70a, 70b, and 70c) may have the same structure as the first etching stopper structure (210 and 211) of FIG. 8.

In an implementation, the lower etching stopper structure (110 and 141) may have the same structure as the lower etching stopper structure (110 and 141) of FIG. 4. In this case, in an area that does not overlap with a resistance pattern 120, the lower etching stopper structure (110 and 141) and the first etching stopper structure (210, 211, and 212) may both have a stack structure in which an Al insulating material film, a Si insulating material film, and an Al insulating material film are sequentially stacked.

FIGS. 17 through 25 illustrate cross-sectional views of stages in a method of fabricating a semiconductor device according to some embodiments of the present disclosure.

For example, FIGS. 17 through 25 illustrate part of the resistance pattern 120 of FIG. 1.

Figure 17:
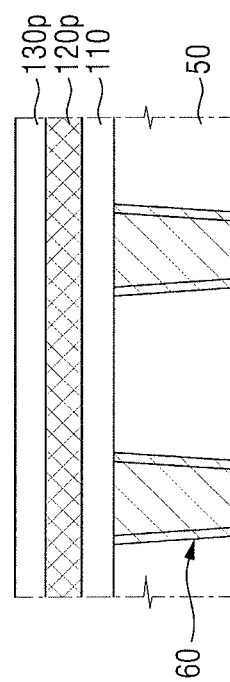
FIGS. 17 through 25 illustrate cross-sectional views of stages in a method of fabricating a semiconductor device according to some embodiments of the present disclosure.

Referring to FIG. 17, a first lower etching stopper film 110, a resistance film 120p, and a pre-etching stopper film 130p may be sequentially formed on a lower interlayer insulating film 50 with a conductive pattern 60 therein.

The resistance film 120p may include, e.g., a conductive material containing Ti, a conductive material containing Ta, or a conductive material containing W. The resistance film 120p will hereinafter be described as including TiN.

The pre-etching stopper film 130p may include, e.g., SiN, SiCN, SiCO, SiON, SiO, or SiOCN.

Figure 18:
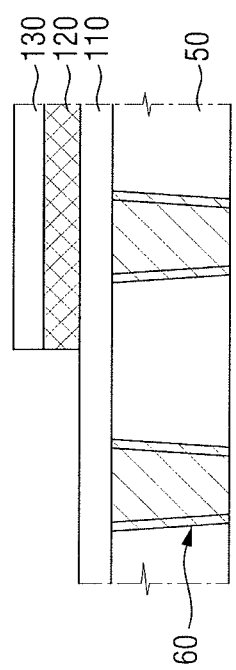

Referring to FIG. 18, a resistance pattern 120 and a first upper etching stopper film 130 may be formed on the first lower etching stopper film 110 by patterning the resistance film 120p and the pre-etching stopper film 130p.

For example, a mask pattern may be formed on the pre-etching stopper film 130p, and parts of the pre-etching stopper film 130p and the resistance film 120p may be removed using the mask pattern. An etching process for forming part of the pre-etching stopper film 130p and an etching process for removing part of the resistance film 120p may be performed ex situ or in situ.

Figure 19:
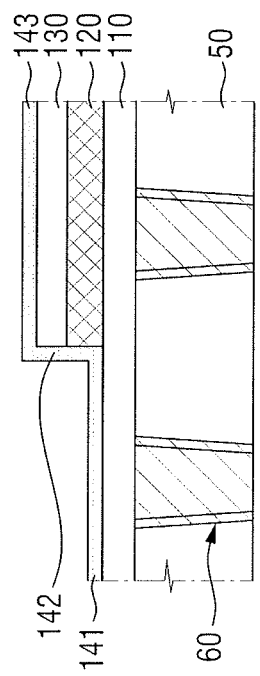

Referring to FIG. 19, an etching stopper capping film (141, 142, and 143) may be formed on the first lower etching stopper film 110 and the first upper etching stopper film 130.

The etching stopper capping film (141, 142, and 143) may be formed along the top surface of the first lower etching stopper film 110, the sidewalls of the resistance pattern 120, and the top surface of the first upper etching stopper film 130.

The etching stopper capping film (141, 142, and 143) may include a lower etching stopper capping film 141, a connecting etching stopper capping film 142, and an upper etching stopper capping film 143.

Figure 20:
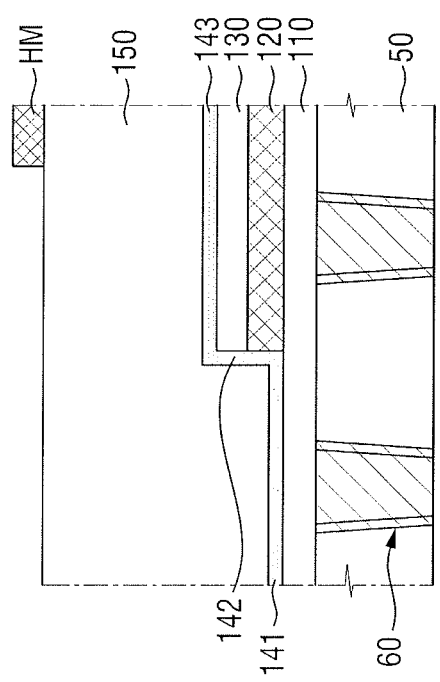

Referring to FIG. 20, a first interlayer insulating film 150 may be formed on the lower etching stopper capping film 141, the connecting etching stopper capping film 142, and the upper etching stopper capping film 143

A hard mask pattern HM may be formed on the first interlayer insulating film 150. The hard mask pattern HM may include, e.g., a metal. The hard mask pattern HM may include, e.g., TiN.

Figure 21:
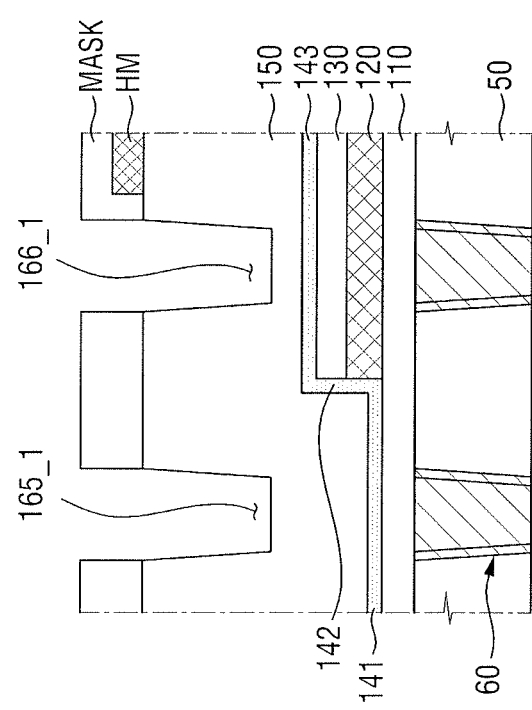
Figure 22:
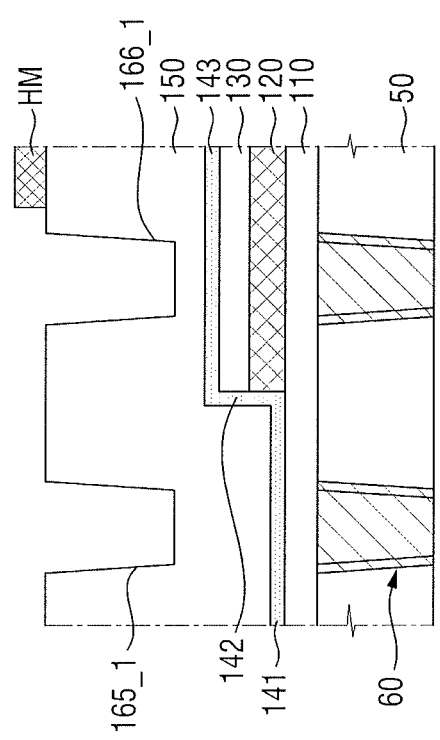

Referring to FIGS. 21 and 22, a via mask pattern MASK may be formed on the first interlayer insulating film 150 and the hard mask pattern HM.

Figure 23:
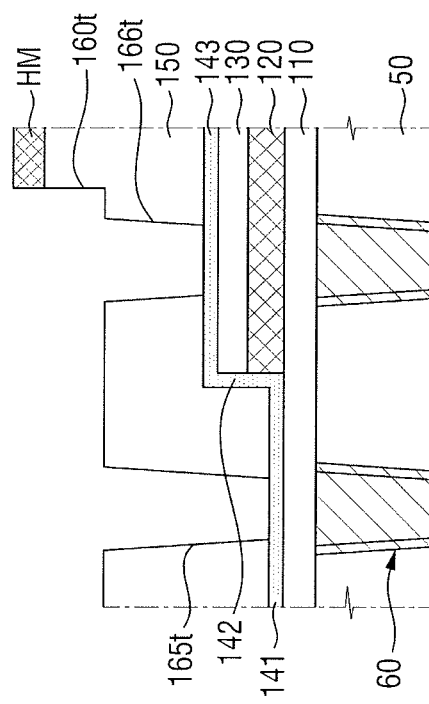

The via mask pattern MASK may include openings that correspond to a resistance via trench 166t and a first wire via trench 165t of FIG. 23.

By using the via mask pattern MASK, a pre-resistance via trench 166_1 and a pre-wire via trench 165_1 may be formed in the first interlayer insulating film 150.

Thereafter, the via mask pattern MASK may be removed.

Referring to FIG. 23, by using the hard mask pattern HM, the first wire via trench 165t, which exposes the lower etching stopper capping film 141, may be formed. By using the hard mask pattern HM, the resistance via trench 166t, which exposes the upper etching stopper capping film 143, may be formed.

Thereafter, a first connecting wire trench 160t may be formed in the first interlayer insulating film 150.

Figure 24:
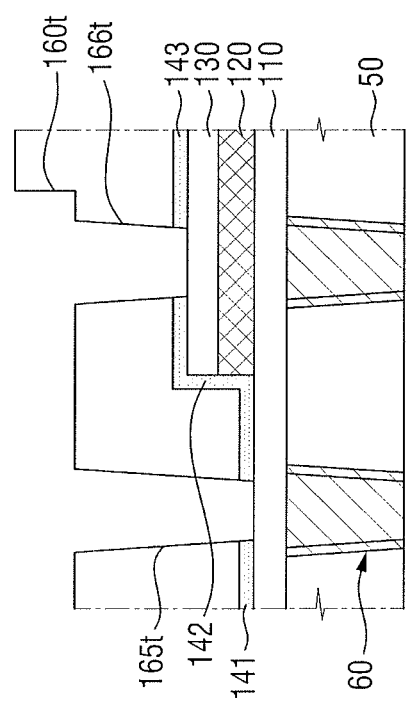

Referring to FIG. 24, part of the first upper etching stopper film 130 may be exposed by removing parts of the upper etching stopper capping film 143 exposed by the hard mask pattern HM and the resistance via trench 166t.

Part of the first lower etching stopper film 110 may be exposed by removing parts of the lower etching stopper capping film 141 exposed by the hard mask pattern HM and the first wire via trench 165t.

For example, the hard mask pattern 11M and part of the etching stopper capping film (141, 142, and 143) may be removed at the same time.

Figure 25:
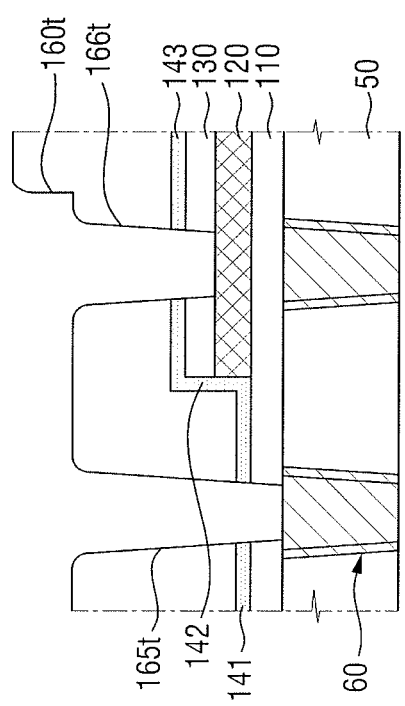

Referring to FIG. 25, the resistance pattern 120 may be exposed by removing part of the first upper etching stopper film 130 exposed by the resistance via trench 166t.

The conductive pattern 60 may be exposed by removing part of the first lower etching stopper film 110 exposed by the first wire via trench 165t.

As the part of the first lower etching stopper film 110 exposed by the first wire via trench 165t is removed, the conductive pattern 60 may be exposed.

While the part of the first upper etching stopper film 130 exposed by the resistance via trench 166t and the part of the first lower etching stopper film 110 exposed by the first wire via trench 165t are removed, the corners of each of the first connecting wire trench 160t, the first wire via trench 165t, and the resistance via trench 166t may be rounded.

Referring again to FIG. 1, a first connecting wire 160, a first wire via 165, and a resistance via 166, which fill the first connecting wire trench 160t, the first wire via trench 165t, and the resistance via trench 166t, respectively, may be formed.

The resistance via 166 may be connected to the resistance pattern 120, and the first wire via 165 may be connected to the conductive pattern 60.

By way of summation and review, as various contacts are used to connect wires, the length of contacts may increase, and as a result, the resistance of the contacts could increase.

One or more embodiments may provide a semiconductor device including metallic resistance.

One or more embodiments may provide a semiconductor device capable of improving performance and reliability by forming metallic resistance in a back-end-of-line (BEOL) process.

One or more embodiments may provide a method of fabricating a semiconductor device capable of improving performance and reliability by forming metallic resistance in a BEOL process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first interlayer insulating film;
a conductive pattern in the first interlayer insulating film;
a resistance pattern on the conductive pattern;
an upper etching stopper film spaced apart from the resistance pattern, extending in parallel with a top surface of the resistance pattern, and including a first metal;
a lower etching stopper film on the conductive pattern, extending in parallel with a top surface of the first interlayer insulating film, and including a second metal;
a connecting etching stopper film connecting the lower etching stopper film and the upper etching stopper film;
a first etching stopper film on the first interlayer insulating film;
a second etching stopper film between the upper etching stopper film and the resistance pattern; and
a second interlayer insulating film on the upper etching stopper film and the lower etching stopper film, wherein:
a distance from a top surface of the second interlayer insulating film to a top surface of the upper etching stopper film is smaller than a distance from the top surface of the second interlayer insulating film to a top surface of the lower etching stopper film,
the connecting etching stopper film includes a metal,
the resistance pattern is on the first etching stopper film,
the first etching stopper film includes a silicon insulating material film, and
the second etching stopper film includes a silicon insulating material film.

2. The semiconductor device as claimed in claim 1, wherein:
the first metal is aluminum, and
the second metal is aluminum.

3. The semiconductor device as claimed in claim 2, wherein:
the lower etching stopper film includes aluminum oxide, aluminum nitride, or aluminum oxycarbide, and
the upper etching stopper film includes aluminum oxide, aluminum nitride, or aluminum oxycarbide.

4. The semiconductor device as claimed in claim 1, wherein:
the connecting etching stopper film is on sidewalls of the resistance pattern, and
the connecting etching stopper film includes the first metal.

5. The semiconductor device as claimed in claim 4, wherein a thickness of the connecting etching stopper film is the same as a thickness of the upper etching stopper film.

6. The semiconductor device as claimed in claim 4, wherein a thickness of the connecting etching stopper film is smaller than a thickness of the upper etching stopper film.

7. The semiconductor device as claimed in claim 1, wherein the lower etching stopper film extends between the top surface of the first interlayer insulating film and a bottom surface of the resistance pattern.

8. The semiconductor device as claimed in claim 1, further comprising:
a substrate; and
a gate electrode and source/drain regions on the substrate, wherein the conductive pattern is connected to at least one of the gate electrode and the source/drain regions.

9. A semiconductor device, comprising:
a substrate;
a first connecting wire in an interlayer insulating film on the substrate;
a resistance pattern on the interlayer insulating film;
a first etching stopper film on a top surface of the resistance pattern;
a second etching stopper film on the interlayer insulating film, extending in parallel with a top surface of the interlayer insulating film, on sidewalls of the resistance pattern, and on a top surface of the first etching stopper film, and including a metal;
a first via penetrating the second etching stopper film, the first via being connected to the first connecting wire;
a second connecting wire on the substrate;
a first etching stopper structure on the second connecting wire;
a second via penetrating the first etching stopper structure, the second via being connected to the second connecting wire; and
a third etching stopper film between the second etching stopper film and the interlayer insulating film,
wherein:

the first via penetrates the third etching stopper film between the second etching stopper film and the interlayer insulating film, the second etching stopper film and the third etching stopper film form a second etching stopper structure, the second connecting wire is in a different metal level from the first connecting wire, and the first etching stopper structure has a different stack structure from the second etching stopper structure.

10. The semiconductor device as claimed in claim 9, wherein the second etching stopper film includes aluminum oxide, aluminum nitride, or aluminum oxycarbide.

11. The semiconductor device as claimed in claim 9, wherein a thickness of a portion of the second etching stopper film on the top surface of the resistance pattern is the same as a thickness of a portion of the second etching stopper film on the sidewalls of the resistance pattern.

12. The semiconductor device as claimed in claim 9, wherein a thickness of a portion of the second etching stopper film in an area that overlaps with the top surface of the resistance pattern is the same as a thickness of a portion of the second etching stopper film in an area that does not overlap with the top surface of the resistance pattern.

13. A semiconductor device, comprising:
a first interlayer insulating film;
a first connecting wire in the first interlayer insulating film;
a first etching stopper film on the first interlayer insulating film;
a resistance pattern on the first etching stopper film and including titanium nitride;
a second etching stopper film on the resistance pattern and in contact with a top surface of the resistance pattern, the second etching stopper film not extending onto sidewalls of the resistance pattern;
a third etching stopper film extending along a top surface of the first etching stopper film, the sidewalls of the resistance pattern, and sides and a top surface of the second etching stopper film, the third etching stopper film including aluminum;
a second interlayer insulating film on the third etching stopper film;
a wire via in the second interlayer insulating film, the wire via being connected to the first connecting wire and passing through the third etching stopper film and the first etching stopper film;
a resistance via in the second interlayer insulating film the resistance via being connected to the resistance pattern and passing through the third etching stopper film and the second etching stopper film; and
a second connecting wire on the wire via and the resistance via, the second connecting wire being connected to at least one of the wire via and the resistance via.

14. The semiconductor device as claimed in claim 13, wherein the third etching stopper film includes aluminum oxide, aluminum nitride, or aluminum oxycarbide.

15. The semiconductor device as claimed in claim 13, wherein:
the first etching stopper film includes a silicon insulating material film, and
the second etching stopper film includes a silicon insulating material film.

16. The semiconductor device as claimed in claim 13, wherein the third etching stopper film is in contact with the resistance pattern.

17. The semiconductor device as claimed in claim 13, further comprising a fourth etching stopper film between the first interlayer insulating film and the first etching stopper film, the fourth etching stopper film including aluminum.

* * * * *